United States Patent [19]

Tomesen et al.

[11] Patent Number: 5,629,959
[45] Date of Patent: May 13, 1997

[54] WIDEBAND SQUARE-LAW DETECTOR HAVING A TRIANGULAR FREQUENCY CHARACTERISTIC AS WELL AS A TRANSMISSION SYSTEM AND A RECEIVER INCLUDING SUCH A DETECTOR

[75] Inventors: Markus T. Tomesen, Eindhoven; Pieter W. Hooijmans, Waalre, both of Netherlands

[73] Assignee: U.S. Philips Corporation, New York, N.Y.

[21] Appl. No.: 388,547

[22] Filed: Feb. 14, 1995

[30] Foreign Application Priority Data

Feb. 18, 1994 [EP] European Pat. Off. ............. 94200413

[51] Int. Cl.$^6$ .................................................. H03D 1/00
[52] U.S. Cl. ..................... 375/340; 359/192; 375/350; 329/300
[58] Field of Search .................... 375/340, 322, 375/324, 325, 334, 335, 272, 346, 347, 348, 349, 350, 269, 323, 200; 329/300, 318, 320, 321, 338, 341, 343, 301; 359/192, 156, 122; 356/349, 285, 350; 342/351; 380/34; 364/822

[56] References Cited

U.S. PATENT DOCUMENTS

| | | | |
|---|---|---|---|
| 3,729,633 | 4/1973 | Eros et al. | 359/189 |
| 4,498,197 | 2/1985 | Chown | 359/195 |
| 4,748,642 | 5/1988 | Bertsche | 375/340 |
| 4,750,217 | 6/1988 | Smith et al. | 359/191 |
| 4,888,817 | 12/1989 | Ryu et al. | 359/192 |
| 4,972,515 | 11/1990 | Shibutani | 359/192 |
| 5,144,467 | 9/1992 | Kitajima et al. | 359/124 |

Primary Examiner—Wellington Chin
Assistant Examiner—William Luther
Attorney, Agent, or Firm—Leroy Eason

[57] ABSTRACT

A square-law detector which provides a square-law relationship between the amplitude of the input signal and the amplitude of the output signal, and having a frequency transfer characteristic which is a continuous function consisting of a rising portion up to a predetermined frequency followed by a falling portion following the predetermined frequency. Thus the frequency characteristic is generally triangular, which is advantageous in that the output signal as function of frequency has a much more uniform, i.e. trapezoidal, pattern than is obtained with a conventional detector having a substantially rectangular frequency transfer characteristic. This is especially important when the detector is used in a receiver for FSK modulated signals having a large frequency deviation, since the modulated signal spectrum then has two relatively discrete power peaks.

6 Claims, 3 Drawing Sheets

WIDEBAND SQUARE-LAW DETECTOR HAVING A TRIANGULAR FREQUENCY CHARACTERISTIC AS WELL AS A TRANSMISSION SYSTEM AND A RECEIVER INCLUDING SUCH A DETECTOR

BACKGROUND OF THE INVENTION

1. Field of the Invention

The invention relates to a square-law detector having an input, an output and means for providing a square-law relationship between the amplitude of the signal applied to the input and the amplitude of the signal produced on the output.

Such a square-law detector is suited for use in a receiver for polarization diversity reception with square-law recombination of baseband signals, such as described in EP-A-474.294.

2. Description of the Related Art

For transporting a baseband signal through a glass fibre in coherent optical transmission systems the light signal from a transmitting laser is amplitude, frequency or phase modulated by the baseband signal before the light signal is fed to the glass fibre.

For demodulating the light signals at the receiver end by conventional electronic components, it is necessary to convert a light signal which has a very high frequency (for example, $10^{14}$ Hz) to a much lower intermediate frequency (for example, $10^9$ Hz). For this purpose, the received light signal is mixed in the receiver with a light signal locally generated by a laser, which mixing operation is performed by an optical directional coupler. As a result, an intermediate frequency signal is obtained having a frequency equal to the difference frequency between the frequency of the received light signal and the frequency of the locally generated light signal.

To have the least possible signal loss due to this mixing operation, it is necessary for the direction of polarization the received light signal and the direction of polarization of the locally generated light signal to be the same. In general the direction of polarization of the received light signal, however, is indefinite and, in addition, not constant in time. Without any precautions being taken, the amplitude of the intermediate frequency signal may therefore vary between a maximum value (if the two directions of polarization are the same) and substantially zero, (if the two directions of polarization are orthogonal).

In general, the problem is solved by splitting the received light signal into two components that have mutually orthogonal directions of polarization. Each signal component is separately mixed with a corresponding polarized component of the locally generated light signal. This mixing produces two intermediate frequency signals. After amplification and demodulation of the intermediate frequency signals, two baseband signals are available whose amplitudes are proportional to the amplitudes of the two mutually orthogonally polarized components of the received light signal.

For obtaining a baseband signal whose amplitude is proportional to the amplitude of the received light signal and irrespective of the direction of polarization thereof, the two baseband signals can be squared and then added together according to their known vector properties. In lieu of squaring the obtained baseband signals, the desired output signal may also be obtained by utilizing a demodulator that has a square-law relationship between the amplitude of the input signal and the amplitude of the output signal.

Another application of a square-law detector is described in GB-A-90.27296. This publication also discusses a receiver for use in a coherent optical transmission system and, more specifically, discusses an AGC system for such a receiver. In this AGC system a discriminator circuit and an intermediate frequency power detector are used. These circuits both include a detector circuit having a square-law characteristic.

If FSK (Frequency Shift Keying) modulation having a large frequency deviation ($\Delta f$) compared with the bit rate is used in an optically coherent transmission system, the modulated signal spectrum has two relatively discrete power peaks as is shown in FIG. 1a. If such a spectrum passes a detector which has a substantially rectangular characteristic and a bandwidth B, as is the case in known detectors and is shown in FIG. 1b, the output signal of the detector plotted against frequency will have the step size shown in FIG. 1c. Such a step size with discrete jumps in the voltage levels is undesired especially in control loops because instabilities will then arise as a result.

SUMMARY OF THE INVENTION

It is an object of the invention to provide a wideband square-law detector whose output voltage plotted against frequency shows a uniform pattern when a signal having a spectrum as shown in FIG. 1a is applied to the input of the detector.

The invention provides a square-law detector of said type, characterized in that the detector has a frequency characteristic whose pattern may be represented by a continuous function which function consists of an ascending part over a first frequency area range and a descending part over a second frequency area range contiguous to the first frequency range. Preferably, the frequency characteristic has a substantially triangular form.

The invention achieves that if a spectrum as shown in FIG. 1a passes such a detector, the output signal of the detector has a much more uniform pattern, more specifically, a trapezoidal pattern.

According to a preferred embodiment of the invention the detector comprises an emitter-follower circuit having art input and an output while, the input of the emitter-follower forming the input of the detector, and at least a series combination of a diode and a capacitor. A terminal of this series combination is coupled to the output of the emitter-follower and the other terminal of this series combination is coupled to a reference potential. The output signal of the detector is available across the capacitor.

The invention likewise relates to a receiver for polarization diversity reception with square-law recombination of baseband signals, comprising two intermediate frequency circuits which each include at least a detector according to the invention. Such a receiver may be of the type described in EP-A-474.294 and GB-A90.27296. The invention further relates to a transmission, system for optically coherent FSK transmission comprising a transmitter and such a receiver.

BRIEF DESCRIPTION OF THE DRAWINGS

The invention will be further explained hereinafter with reference to the drawings in which.

DESCRIPTION OF THE PREFERRED EMBODIMENTS

Figures 2A, 2B:
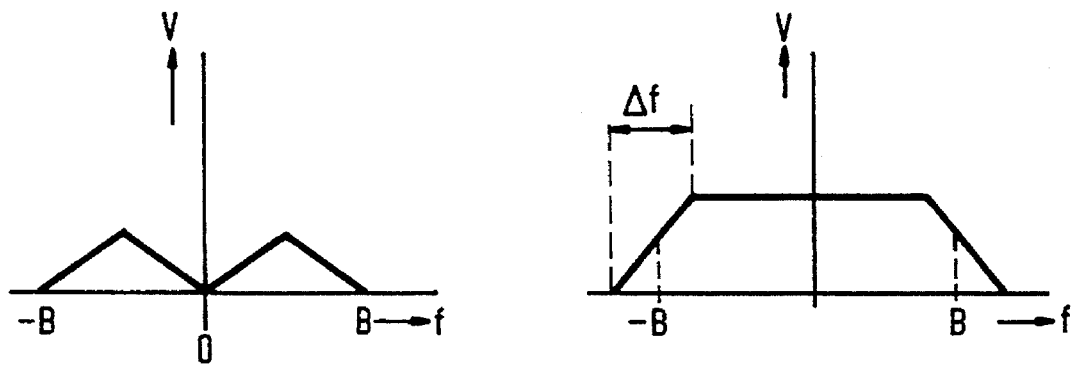
FIGS. 2a,b: show the frequency characteristic and the output signal of the detector according to the invention, respectively, when a signal having a spectrum as shown in FIG. 1a is supplied.

FIG. 2a shows the frequency characteristic of the detector according to the invention in the case where $\Delta f = B/2$.

Figures 1A, 1B, 1C:
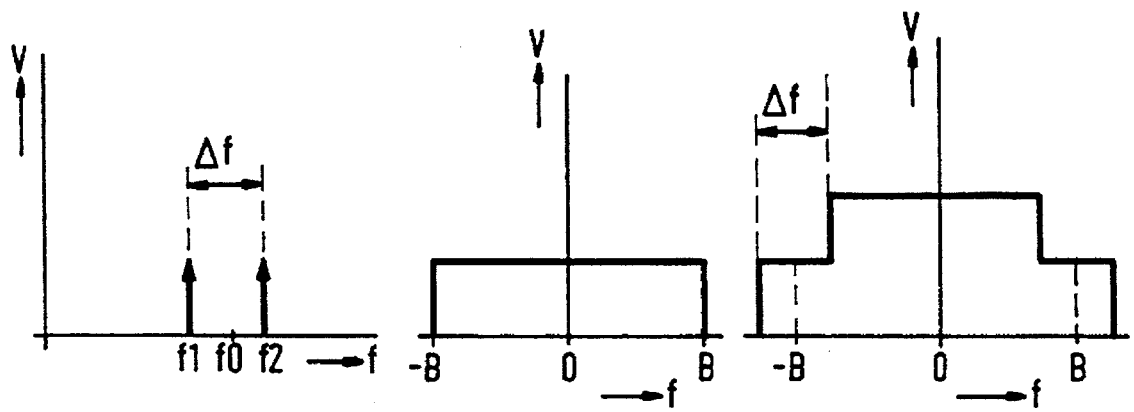
FIGS. 1a,b,c: respectively show the frequency spectrum of a coherent optical signal FSK, the frequency characteristic of a known square-law detector and the output signal of this detector when the signal shown in FIG. 1a is supplied thereto.

FIG. 2b shows the output voltage plotted against frequency as obtained if a signal having a spectrum as shown in FIG. 1a passes the detector having the theoretical characteristic shown in FIG. 2a.

Figure 3:
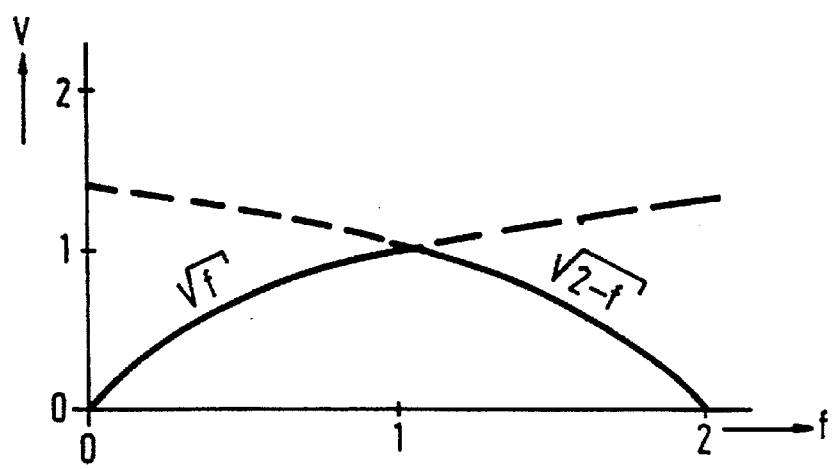
FIG. 3: shows the desired characteristic of a part of the detector according to the invention.

For obtaining the desired triangular form of the detector characteristic, that part of the detector carrying out the square-law detection itself must be preceded by a filter whose normalized filter transfer characteristic $H(f)$ has the shape shown in FIG. 3.

$$0 < f < 1: \quad H(f) = \sqrt{f}$$
$$1 < f < 2: \quad H(f) = \sqrt{2-f}$$
$$f > 2: \quad H(f) = 0$$

There should be observed that the characteristic shown in FIG. 3 is only shown for a positive frequency.

When, hereafter, this characteristic is squared, a detector transfer is obtained for which the following holds:

H'(f)=f for 0<f<1;

H'(f)=2−f for 1<f<2 en

H'(f)=0 for f>2.

It will be noticed at once that this is the desired characteristic having a triangular shape.

A filter having the characteristic shown in FIG. 3 can for narrow-band applications with relatively low frequencies be realised by a higher-order LC network. For wideband applications with high frequencies (GHz area), however, this is impossible due to the great effect of parasitic capacitances and self-inductance elements.

Surprisingly, the invention has discovered that an emitter-follower circuit having a capacitance load approaches the desired frequency characteristic extremely well.

Figure 4:
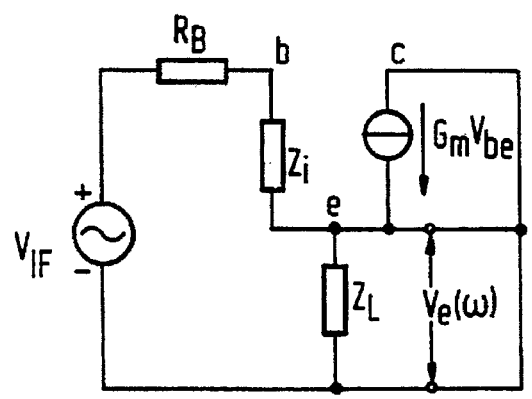
FIG. 4: shows the equivalent-circuit diagram of an emitter-follower.

FIG. 4 shows the well-known equivalent-circuit diagram of an emitter-follower.

For the impedances of the emitter-follower the following holds:

$$Z_i = \frac{R_i}{1 + pR_i C_i}, \text{ and } Z_L = \frac{R_L}{1 + pR_L C_L}$$

There can be derived:

$$H_{ef}(\omega) = \frac{V_e(\omega)}{V_{IF}} = A_0 \frac{[1 + p\tau_F]}{\frac{p}{\omega_0} + \frac{2\beta p}{\omega_0} + 1}$$

wherein:

$n_p$ = Laplace operator $$A_0 = \frac{R_L(1 + g_m R_i)}{R_b + R_i + R_L(1 + g_m R_i)}$$

$$\tau_f = \frac{R_i C_i}{1 + g_m R_i}$$

$$\omega_0 = \sqrt{\frac{R_b + R_i + R_L(1 + g_m R_i)}{R_b R_i R_L C_i C_L}}$$

$$\beta = \frac{R_i C_i [R_b + R_L] + R_L C_L [R_b + R_i]}{2 \sqrt{R_b R_i R_L C_i C_L [R_b + R_i + R_L(1 + g_m R_i)]}}$$

The zero in the transfer function of the emitter-follower has no effect in the frequency area important to the invention, because it is located near to the transistor transition frequency $f_t$. This can easily be recognized because with $$g_m R_i \gg 1 \text{ it holds that: } \frac{1}{2\pi \tau_f} \approx \frac{g_m}{2\pi C_i} = f_t$$

If the zero and the statistical transfer $A_0$ are discarded, the transfer characteristic will be:

$$H_{ef}(\omega) = \frac{V_e(\omega)}{V_{IF}} = \frac{1}{\frac{j\omega}{\omega_0} + \frac{2\beta j\omega}{\omega_0} + 1}$$

This is the formula for the transfer characteristic of a standard second-order system in which:
$\omega_o$=the undamped resonance frequency
$\beta$=damping factor
and in which the peak in the frequency transfer characteristic is situated near the resonance frequency $$\omega_r = \omega_0 \sqrt{1 - 2\beta^2} \; .,$$

It has appeared that with a value for $\beta$ in the region of $\beta = 0.4 - 0.6$ a good approximation is obtained of the characteristic shown in FIG. 3 for frequencies higher than the resonance frequency.

For the frequency band from DC to the resonance frequency, an additional filter function is obtained resulting from the fact that the differential resistance of the diode producing the square-law transfer characteristic cooperates with a pair of capacitors.

Figure 5:
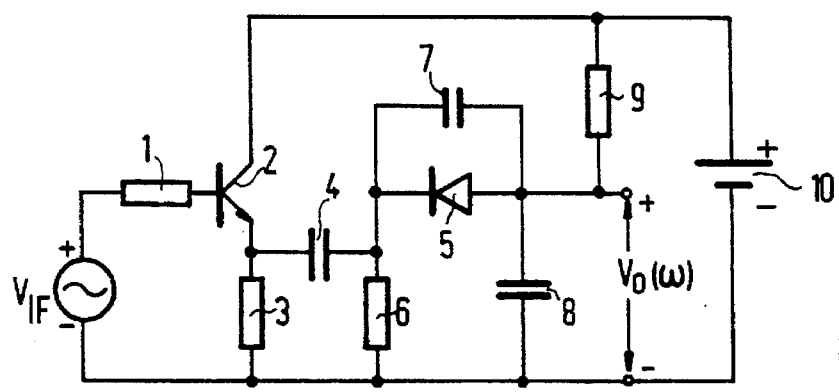
FIG. 5: shows a first embodiment of the detector according to the invention.

FIG. 5 shows the basic circuit diagram of the detector according to the invention. The emitter-follower is formed by the base resistor 1, the transistor 2 and the emitter-resistor 3. The collector of the transistor 2 is connected to the supply voltage. The input signal $V_{IF}$ is applied to the input i.e. the base of the emitter-follower. The output signal on the emitter of the transistor 2 is coupled via a coupling capacitor 4 to a second part of the detector configured around a diode 5. The cathode of the diode 5 is connected to the free terminal of the capacitor 4 and is connected to earth via a load resistor 6. A first capacitor 7 is connected in parallel with the diode 5. Such capacitor, however, need not be physically present in practice but is formed by the parasitic capacitance of the diode 5. The anode of the diode 5 is connected to a first terminal of the second capacitor 8 whose other terminal is connected to earth. The anode of the diode 5 further receives via resistors 6 and 9 a setting current from a DC voltage source 10. The diode is preferably a Schottky diode. The output signal of the detector may be tapped via the terminals of the diode. In principle, it is alternatively possible to have the diode 5 and the capacitor 8 change places, so that the diode is connected to earth via a terminal. In that case, the output signal is continued to be available via the capacitor 8.

Figure 6:
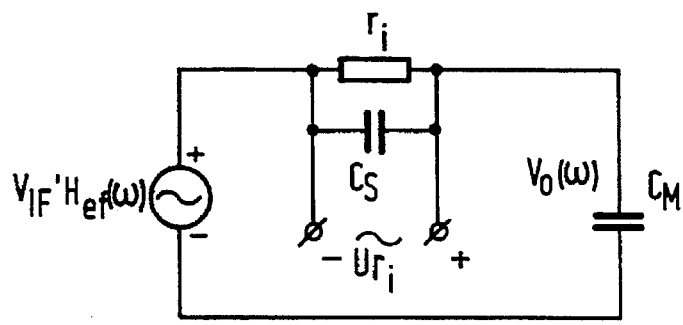
FIG. 6: shows the equivalent-circuit diagram of a part of the circuit shown in FIG. 5.

FIG. 6 shows the equivalent circuit diagram of the diode 5 and the capacitors 7 and 8. The diode is represented by its differential resistor $r_i$ thereof and the capacitors 7 and 8 are referenced $C_S$ and $C_M$, respectively. Across the diode there is a voltage $V_{IF} \cdot H_{ef}(\omega)$ available which is the input voltage of the emitter-follower multiplied by the transfer function of the emitter-follower.

For the output voltage $V_O(\omega)$ the following holds:

$$V_0(\omega) = a_2 \cdot |u^2 r_i(\omega)|$$

where $a_2$ is the square-law efficiency of the diode 5 and $u^2_{ri}(\omega)$ is the high frequency voltage across diode 5.

From FIG. 6 there may further be derived that:

$$U_{r_i}(\omega) = V_{IF} \cdot H_{ef}(\omega) \cdot \frac{j\omega r_i C_M}{1 + j\omega r_i [C_M + C_S]}$$

with: $r_i C_M + \tau_1$ and $r_i [C_M + C_S] = \tau_2$:

$$|u_{r_i}(\omega)| = \hat{V}_{IF} \cdot |H_{ef}(\omega)| \cdot \frac{\omega \tau_1}{\sqrt{1 + (\omega \tau_2)^2}}$$

$$V_0(\omega) = a_2 \cdot \hat{V}_{IF}^2 \cdot |H_{ef}(\omega)|^2 \cdot \frac{(\omega \tau_1)^2}{1 + (\omega \tau_2)^2}$$

With values for $\tau_1$ and $\tau_2$ of the order of 0.2–0.4 and with a normalized filter characteristic having a peak at 1 Hz, a good approximation of the desired filter characteristic is obtained for frequencies between DC and the resonance frequency.

Figure 7:
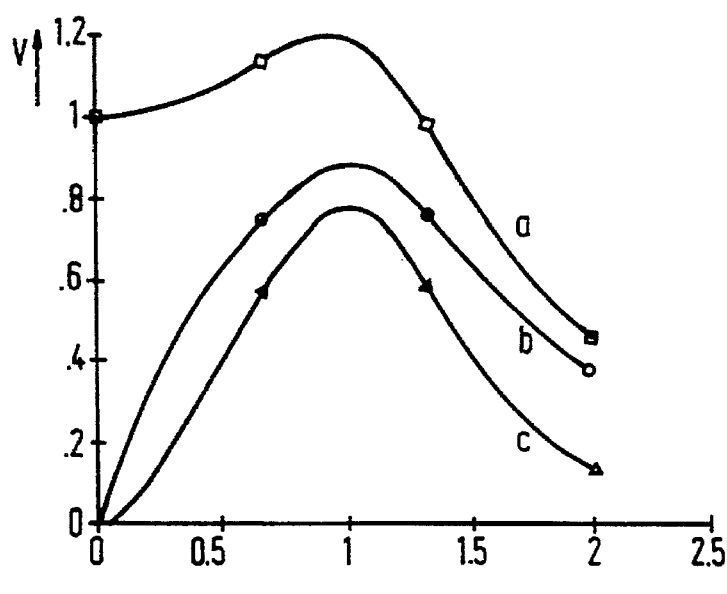
FIGS. 7a,b,c: show simulated transfer characteristics for an emitter-follower, the part of the circuit shown in FIG. 6 and the complete circuit shown in FIG. 5, respectively.

In FIG. 7 curve a shows the simulated transfer of the normalized frequency characteristic of an emitter-follower shown in FIG. 4, curve b of $u_{ri}(\omega)$ shown in FIG. 6 and curve c of $V_O(\omega)$ shown in FIG. 6. It will be evident that curve c forms a very good approximation of the desired detection characteristic having a triangular voltage versus frequency relationship.

Figure 8:
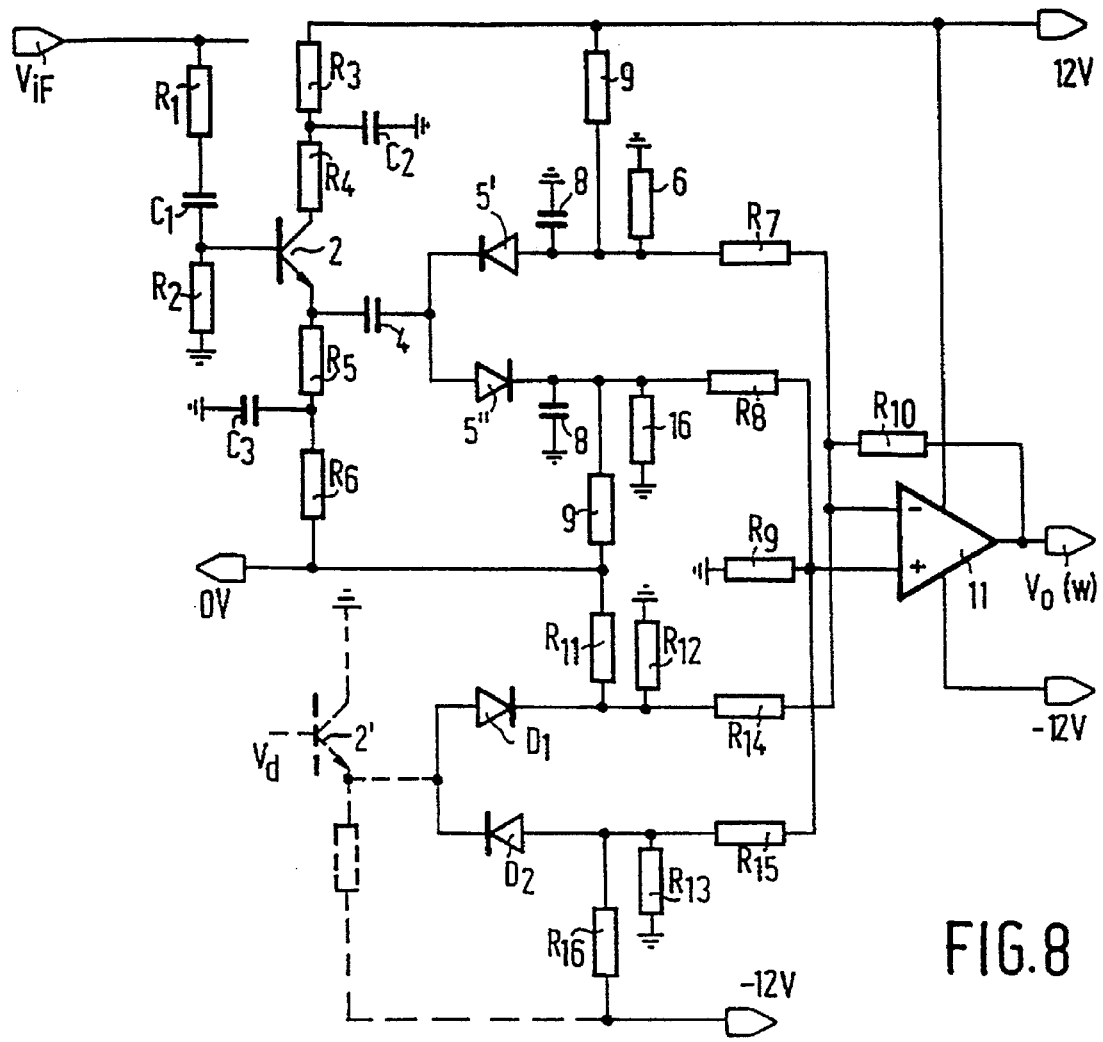
FIG. 8: shows a second embodiment of the detector according to the invention.

FIG. 8 shows a practical embodiment for the detector according to the invention. In this drawing Figure only the components also appearing in FIG. 5 and essential to a proper operation of the detector are denoted by a reference character. The other components are adjusting components and are referenced $R_x$ and $C_x$ and the component values thereof are shown in Table I. In the practical embodiment two diodes 5' and 5" having opposite polarities are included for the square-law detection; this does not affect the operation of the detector, but doubles the detection efficiency. It will be evident that in that case also the resistors 6, 9 and the capacitor 8 are included twofold. The use of a symmetrical circuit for producing a bias voltage in the two diodes 5' and 5" by means of resistors 9 is advantageous in that the DC offset voltages and the offset drift due to variations of temperature are mutually eliminating by the subtraction in amplifier 11. Furthermore, a second, identical circuit including two diodes $D_1$ and $D_2$ and adjusting resistors $R_{11}$–$R_{16}$ is provided, which circuit is not supplied with a high frequency signal and whose sole function is to compensate for the variations in the supply voltage.

Figure 9:
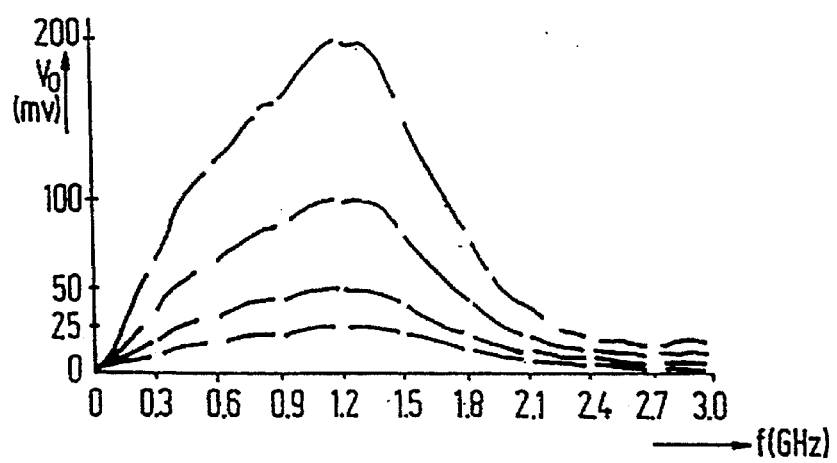
FIG. 9: shows the measured transfer characteristic of the detector shown in FIG. 8.

FIG. 9 shows the detection characteristic realised in practice with a detector shown in FIG. 8. The desired triangular pattern of the detection characteristic is evident and the output voltage has an accurate square-law relationship with the level of the input voltage. This may also be deduced from the fact that the four curves shown correspond to the output signal of the detector if an input signal is supplied to the detector, which input signal is 3 dB higher for every obtained output curve. The peak values of the curves are found at 25 mV, 50 mV, 100 mV and 200 mV respectively, and thus constantly increase by a factor of 2 if the input voltage increases by a factor of $\sqrt{2}$.

The circuit shown in FIG. 8 may also be simply realised in integrated form if the base of transistor 2 is supplied with a setting voltage that is approximately equal to the threshold voltage Vd of the transistor 2. As a result, the voltage on its emitter is about 0 volts and the coupling capacitor 4 which possesses a non-integrable capacitance value may be omitted. The diodes $D_1$ and $D_2$ are in that case also to be connected to a transistor 2' arranged as an emitter-follower, whose base also receives the threshold voltage as an input voltage, but not VIF. This is shown in dashed lines in FIG. 8. Any remaining DC voltages on the two emitters are then eliminated in the differential amplifier 11 of FIG. 8, so that only the detected signal is present on the output of the differential amplifier 11.

Figure 10:
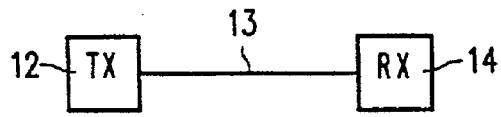
FIG. 10: shows a basic circuit diagram of a transmission system according to the invention.

FIG. 10 shows the basic circuit diagram of a transmission system according to the invention, comprising a transmitter 12, for example, a transmitter for coherent optical transmission known per se and a receiver 14 that receives the optical signals transmitted by the transmission path 13. The receiver is of the type described in EP-A-474.294 or in GB-A-90.27296 and comprises at least a detector according to the invention as is shown in FIG. 5 or 8. An example of the transmitter for coherent optical transmission is described, for example, in the article "Penalty Free Biphase Line Coding for Pattern Independent FSK Coherent Transmission Systems" by P. Hooijmans et al. in Journal of Lightwave Technology; Vol. 8, No. 3, Mar. 1990, pages 323–328.

TABLE I

| | |
|---|---|
| $R_1 =$ | 150 Ω |
| $R_2 = R_3 =$ | 820 Ω |
| $R_4 = R_6 =$ | 47 Ω |
| $R_5 =$ | 1 KΩ |
| $R_7 = R_8 = R_{14} = R_{15} =$ | 39 KΩ |
| $R_9 = R_{10} =$ | 820 KΩ |
| $R_{11} = R_{16} =$ | 100 KΩ |
| $R_{12} = R_{13} =$ | 10 KΩ |
| $6 =$ | 10 KΩ |
| $9 =$ | 100 KΩ |
| diode 5', 5" = $D_1 = D_2 =$ | BAT 17 |
| $C_1 = C_2 = C_3 =$ | 22 nF |
| capacitor 4 = | 22 nF |
| capacitor 8 = | 10 pF |

We claim:

1. A receiver for polarization diversity reception of an optical signal which is modulated by an FSK baseband signal, the receiver having an intermediate frequency (IF) circuit which derives an IF signal from the received modulated optical signal and a square law detector for detecting the IF signal, the square law detector comprising:

an input for the IF signal;

transfer circuit means coupled to said input for processing the IF signal in accordance with a first frequency transfer characteristic in the form of a continuous function having an ascending branch up to a predetermined frequency and a descending branch thereafter, a resulting processed IF signal being produced at an output of said transfer circuit means; and square law circuit means coupled to the output of said transfer circuit means for detecting an FSK baseband component of the processed IF signal by subjecting the processed IF signal to further processing in accordance with a square law amplitude transfer characteristic, the detected FSK baseband component being produced at an output of said square law circuit means, said output being an output of said square law detector;

said transfer circuit means and said square law circuit means together having a combined frequency transfer characteristic in the form of a continuous function having an ascending branch up to said predetermined frequency and a descending branch thereafter, the angle between the ascending and descending branches of said combined transfer characteristic being narrower than the angle between the ascending and descending branches of said first transfer characteristic.

2. A receiver as claimed in claim 1, wherein said transfer circuit means is an emitter-follower circuit, said square law circuit means comprises a diode and a capacitor in series, and an output of said square law circuit means is at a junction between said diode and said capacitor.

3. A receiver as claimed in claim 1, wherein said square law circuit means further comprises a second diode connected in parallel with said first-named diode, the two diodes having opposite polarities.

4. A square law detector as claimed in claim 3, wherein said transfer circuit means is an emitter-follower circuit, said square law circuit means comprises a diode and a capacitor in series, and an output of said square law circuit means is at a junction between said diode and said capacitor.

5. A square law detector having an input for an intermediate frequency (IF) signal which is modulated by an FSK baseband signal, an output, and further comprising:

transfer circuit means coupled to said input for processing the IF signal in accordance with a first frequency transfer characteristic in the form of a continuous function having an ascending branch up to a predetermined frequency and a descending branch thereafter, a resulting processed IF signal being produced at an output of said transfer circuit means; and square law circuit means coupled to the output of said transfer circuit means for detecting an FSK baseband component of the processed IF signal by subjecting the processed IF signal to further processing in accordance with a square law amplitude transfer characteristic, the detected FSK baseband component being produced at an output of said square law circuit means, said output being an output of said square law detector;

said transfer circuit means and said square law circuit means together having a combined frequency transfer characteristic in the form of a continuous function having an ascending branch up to said predetermined frequency and a descending branch thereafter, the angle between the ascending and descending branches of said combined transfer characteristic being narrower than the angle between the ascending and descending branches of said first transfer characteristic.

6. A square law detector as claimed in claim 5, wherein said square law circuit means further comprises a second diode connected in parallel with said first-named diode, the two diodes having opposite polarities.

* * * * *